(12) United States Patent
Sekimoto (10) Patent No.: US 8,794,499 B2
(45) Date of Patent: Aug. 5, 2014

(54) METHOD FOR MANUFACTURING SUBSTRATE

(75) Inventor: Yasuyuki Sekimoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/305,999

(22) Filed: Nov. 29, 2011

(65) Prior Publication Data

US 2012/0298728 A1 Nov. 29, 2012

Related U.S. Application Data

(63) Continuation of application No. PCT/JP2010/003627, filed on May 31, 2010.

(30) Foreign Application Priority Data

Jun. 1, 2009 (JP) .................................. 2009-131903

(51) Int. Cl.
*B23K 31/00* (2006.01)
*B23K 31/02* (2006.01)
*H05K 3/40* (2006.01)
*H05K 1/18* (2006.01)
*H05K 3/46* (2006.01)

(52) U.S. Cl.
CPC .............. *H05K 1/185* (2013.01); *H05K 3/4647* (2013.01); *H05K 3/4652* (2013.01); *H05K 2201/0355* (2013.01); *H05K 3/4617* (2013.01); *H05K 3/4069* (2013.01); *H05K 2203/1189* (2013.01)
USPC .................. 228/122.1; 228/123.1; 228/124.1; 228/124.5; 228/178; 228/179.1; 438/613

(58) Field of Classification Search
USPC .................. 438/613; 228/122.1, 123.1, 124.1, 228/124.5, 178, 179.1
See application file for complete search history.

(56) References Cited

U.S. PATENT DOCUMENTS 5,736,681 A 4/1998 Yamamoto et al.
6,319,810 B1 * 11/2001 Ochiai et al. ................... 438/616

(Continued)

FOREIGN PATENT DOCUMENTS

JP 7-074466 A 3/1995
JP 7-231167 A 8/1995

(Continued)

OTHER PUBLICATIONS

Official Communication issued in International Patent Application No. PCT/JP2010/003627, mailed on Jul. 20, 2010.

*Primary Examiner* — Erin Saad
(74) *Attorney, Agent, or Firm* — ;Keating & Bennett, LLP (57) ABSTRACT

In a method for manufacturing a substrate, connections are provided through metal columns of bumps press-fitted into an insulating resin layer between metal foils contact-bonded to a thermosetting insulating resin layer. Bumps of a conductive paste containing metal fillers are formed on a metal foil which is to be contact-bonded to an insulating resin layer, the bumps are heated to bound the metal fillers to each other, and form a metallic bond between the bumps and the metal foil, the metal columns are press-fitted into the insulating resin layer to contact-bond the metal foil to the insulating resin layer, and join the tips of the metal columns to a metal foil, the metal columns are then reheated to form a metallic bond between the metal columns and the metal foil.

6 Claims, 7 Drawing Sheets

REHEATING AND CONTACT BONDING PROCESS

(56) References Cited

U.S. PATENT DOCUMENTS

| | | |
|---|---|---|
| 6,360,939 B1 * | 3/2002 | Paruchuri et al. .......... 228/248.5 |
| 6,686,268 B2 * | 2/2004 | Farnworth .................... 438/613 |
| 6,872,893 B2 | 3/2005 | Fukuoka et al. |
| 2002/0112879 A1 | 8/2002 | Iwashita et al. |
| 2008/0041619 A1 | 2/2008 | Lee et al. |

FOREIGN PATENT DOCUMENTS

| | | |
|---|---|---|
| JP | 11-031715 A | 2/1999 |
| JP | 11-135947 A | 5/1999 |
| JP | 2000-013028 A | 1/2000 |
| JP | 2002-076621 A | 3/2002 |
| JP | 2002-100851 A | 4/2002 |
| JP | 2002-246753 A | 8/2002 |
| JP | 2002-353617 A | 12/2002 |
| JP | 2003-086947 A | 3/2003 |
| JP | 2005-302991 A | 10/2005 |
| JP | 2006-196785 A | 7/2006 |
| JP | 2007-184631 A | 7/2007 |
| JP | 2007-258736 A | 10/2007 |
| JP | 2008-047917 A | 2/2008 |
| WO | 2009/028239 A1 | 3/2009 |

* cited by examiner

FIG. 1A
BUMP FORMATION PROCESS

2 BUMP
1 METAL FOIL

FIG. 1B
METAL COLUMN FORMATION (HEATING) PROCESS

5 METAL COLUMN

FIG. 1C
PRESS-FITTING PROCESS

6 INSULATING RESIN LAYER
7 METAL FOIL

FIG. 1D
REHEATING AND CONTACT BONDING PROCESS

9 SUBSTRATE

FIG. 2

3 CONDUCTIVE PASTE

4 METAL FILLER

PRESS-FITTING PROCESS

FIG. 7B

REHEATING AND CONTACT BONDING PROCESS

FIG. 8A

PRESS-FITTING PROCESS

FIG. 8B

REHEATING AND CONTACT BONDING PROCESS

FIG. 9A
PRESS-FITTING PROCESS

FIG. 9B
REHEATING AND CONTACT BONDING PROCESS

FIG. 9C
PRESS-FITTING PROCESS

FIG. 9D
REHEATING AND CONTACT BONDING PROCESS

METHOD FOR MANUFACTURING SUBSTRATE

BACKGROUND OF THE INVENTION

1. Field of the Invention

The present invention relates to a method for manufacturing a substrate, in which metal columns of bumps press-fitted into an insulating resin layer provide connections between metal foils contact-bonded to a thermosetting insulating resin layer, or between a metal foil contact-bonded to a thermosetting insulating resin layer and an electrode of an electronic component built in the insulating resin layer, and more particularly relates to an improvement in reliability of an electrical connection.

2. Description of the Related Art

In general, double-sided wiring boards and multilayer wiring substrates are manufactured by connecting a wiring pattern of a metal foil on one principal surface of an insulating resin layer (organic resin layer) and a wiring pattern of a metal foil on the other principal surface thereof to each other through the use of metal columns penetrating through the insulating resin layer. In this case, when the metal columns are to be formed with the use of vias, the insulating resin layer requires the use of hole-forming processing, plating processing, etc., which make the manufacturing process complicated, and thus expensive, which is further also disadvantageous in that the component mounting density is limited.

Therefore, it has been proposed that this type of substrate is manufactured by press-fitting conductor bumps into an insulating resin layer from both principal surfaces of the insulating resin layer, and joining the tips of the bumps on the both principal surfaces so as to crush each other, thereby forming the metal columns (for example, see Japanese Patent No. 3474894 (paragraphs [0006] to [0017], FIG. 1, etc.)).

Figure 10A:
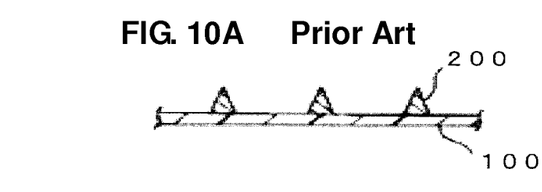
FIGS. 10A-10C are explanatory views of a method for manufacturing a conventional substrate.
Figure 10B:
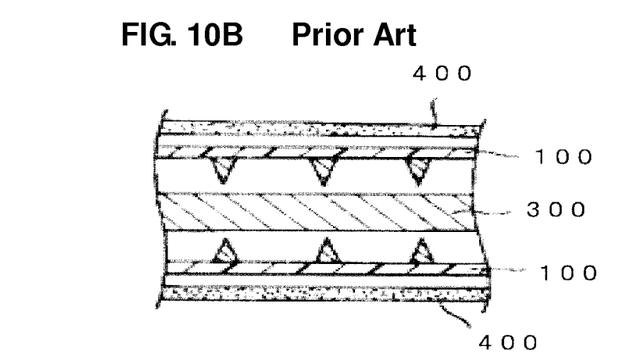
Figure 10C:
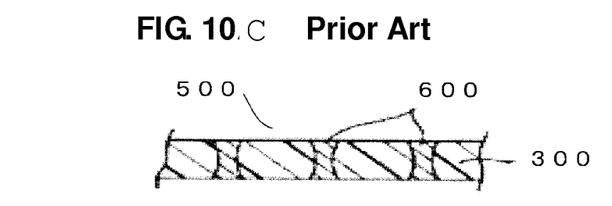

FIGS. 10A-10C schematically illustrate an example of a method for manufacturing a substrate as described in Japanese Patent No. 3474894, in which chevron bumps 200 of a conductive paste are formed on one side of a supporting base sheet 100 of a polyimide resin film (FIG. 10A). In addition, a thermoplastic polyetherimide resin film is prepared as a synthetic resin sheet (insulating resin layer) 300. Then, the three layers of the supporting base sheet 100 with the conductive bumps 200, the synthetic resin sheet 300, and the other supporting base sheet 100 with the conductive bumps 200 are stacked to form a laminated body, in such a way that the conductive bumps 200 are opposed to each other. Furthermore, a polyimide resin film of the same type as the supporting sheet 100 or aluminum foil is stacked and placed as a backing plate 400 on the other sides opposite to the bump formation sides of the stacked supporting sheets 100 (FIG. 10B), and the backing plates 400 are placed between hot plates for hot pressing, which backing plates 400 are kept at 120° C. and arranged to keep the synthetic resin sheet 300 thermoplastic under pressure, and cooled to separate the sheets 100 and 400, thereby forming a final substrate 500. The substrate 500 has, as shown in FIG. 10C, metal columns 600 formed as the connecting conductors, which are obtained by electrically connecting the bumps 200 in physical contact with each other, in such a way that the conductive bumps 200 on the both principal surfaces of the synthetic resin sheet 300 are press-fitted into the synthetic resin sheet 300 to crush the tips of the bumps 200 on both sides, and undergo plastic deformation. The both end surfaces of the metal columns 600 are joined to, for example, wiring patterns of metal foil formed by printing or the like on the both principal surfaces of the synthetic resin sheet 300, thereby manufacturing a printed wiring board (substrate) 500 with the metal columns 600 forming the connecting conductors to penetrate through the synthetic resin sheet 300.

In the case of the method for manufacturing a substrate as described in Japanese Patent No. 3474894, the metal columns 600 penetrating through the synthetic resin sheet 300 are formed in such a way that the bumps 200 on the both principal surfaces, which are press-fitted into the synthetic resin sheet 300, have tips crushed to each other to undergo plastic deformation, thereby only forming electrically connecting conductors in physical contact. Therefore, the metal columns 600 lack reliability as an electrically connecting conductor, and have the problem of being unable to improve the reliability of the electrical connection between both principal surfaces of the synthetic resin sheet 300.

Thus, in the field of manufacturing substrates such as double-sided wiring boards and multilayer wiring substrates, it has been desired to manufacture a substrate with improved reliability of an electrical connection between metal foils on both principal surfaces of an insulating resin layer by a simple and inexpensive approach which requires no hole-forming processing or plating processing for the insulating resin layer unlike the synthetic resin sheet 300. Furthermore, in the field of manufacturing built-in component substrates with electronic components such as capacitors, coils, and transistors built in an insulating resin layer such as the synthetic resin sheet 300, it has been also desired to improve the reliability of an electrical connection between a wiring pattern of a metal foil and electrodes (external electrodes) of the electronic components by a simple and inexpensive approach.

SUMMARY OF THE INVENTION

Preferred embodiments of the present invention provide connections through metal columns of bumps press-fitted into an insulating resin layer between metal foils contact-bonded to a thermosetting insulating resin layer, or between a metal foil contact-bonded to a thermosetting insulating resin layer and an electrode of an electronic component built in the insulating resin layer in a simple and inexpensive manner, without carrying out hole-forming processing, plating processing, etc., of the insulating resin layer, and thus improve the reliability of the electrical connection of the metal columns spectacularly when a substrate is manufactured according to preferred embodiments of the present invention.

A method for manufacturing a substrate according to a preferred embodiment of the present invention provides a unique feature in that a bump of a conductive paste containing metal fillers which can be melted at a temperature lower than a curing temperature of a thermosetting insulating resin layer is formed on a metal foil which is to be contact-bonded to the insulating resin layer, the bump is heated to a temperature lower than the curing temperature, at which the metal fillers are melted, to form the metal fillers bound to each other by melting, and form a metallic bond between the bump and the metal foil, thereby integrally connecting a metal column of the bump to the metal foil, the metal column is press-fitted into the insulating resin layer before being completely cured, thereby contact-bonding the metal foil to the insulating resin layer, and joining a tip of the metal column to an opposed metallic member, and the insulating resin layer is subjected to a heat treatment after the joining step to reheat the metal column, thereby re-melting the metal fillers, and forming a metallic bond between the metal column and the metallic member to integrally connect the metal column to the metallic member.

In a method for manufacturing a substrate according to a preferred embodiment the present invention, the metal foil is preferably a metal foil contact-bonded to one principal surface of the insulating resin layer, and the metallic member is preferably a metal foil contact-bonded to the other principal surface of the insulating resin layer.

In addition, the insulating resin layer preferably has a built-in electronic component, and the metallic member is preferably an electrode of the electronic component.

Furthermore, the conductive paste preferably includes a Bi—Sn alloy.

According to a preferred embodiment of the present invention, the metal bump formed on the metal foil conductor which is to be contact-bonded to the thermosetting insulating resin is subjected to a heating treatment at a low temperature, thereby making it possible to cause the metal fillers of the bump bound to each other by melting, and cause a metallic bond formed by diffusion in the solid layer between the bump and the metal foil, thereby providing a favorable electrical connection between the metal foil and the metal column of the bump. Then, the metal column is press-fitted into the uncured or semi-cured insulating resin layer before being completely cured, thereby contact-bonding the metal foil to the insulating resin layer and joining the tip of the metal column to the opposed metallic member inside or outside the insulating resin layer, and the insulating resin layer is then subjected to a heat treatment to reheat the metal column, thereby making it possible to re-melt the metal fillers of the metal column, and form a metallic bond between the metal column and the metallic member by alloying through diffusion in the solid layer, thus providing a highly favorable electrical connection between the metal foil and the metallic member.

In this case, the metal foil contact-bonded to the insulating layer and the metallic member are electrically connected quite tightly by a metallic bond of alloying through diffusion in the solid layer between the metal bump integrally with the metal foil, which is press-fitted into the insulating resin layer from one main principal surface thereof, and the metallic member, rather than being connected by metal bumps in physical contact with each other, which are press-fitted from both principal surfaces of an insulating resin layer to be opposed to each other, as in a conventional case. Thus, the reliability of the electrical connection is improved spectacularly.

According to a preferred embodiment of the present invention, the metal bump is formed on the metal foil on one principal surface of the insulating resin layer, heated at a low temperature to be integrated, and then press-fitted into the insulating resin layer. Then, the metal column of the bump press-fitted in the insulating resin layer is, based on reheating, electrically connected quite tightly to the metal foil contact-bonded to the other principal surface of the insulating resin layer, by a metallic bond of alloying through diffusion in the solid layer. Thus, the reliability of the electrical connection is improved spectacularly.

According to a preferred embodiment of the present invention, the metallic member preferably is an external electrode of an electronic component built in the insulating resin layer, and the metal foil on one principal surface or the other principal surface of the insulating resin layer is thus electrically connected to the external electrode quite tightly by a metallic bond of alloying through the diffusion in the solid layer. Thus, a built-in component substrate can be manufactured which is spectacularly improved in the reliability of the electrical connection. Moreover, when the electronic component in the insulating resin layer is a component with an electrode connected to the metal foil on the other principal surface of the insulating resin layer, the metal foil on one principal surface of the insulating resin layer is electrically connected through the metal column and the electrode of the electronic component to the metal foil on the other principal surface of the insulating resin. Therefore, the metal foils on the both principal surfaces of the insulating resin layer are connected to each other without newly forming any through vias, thereby eliminating the need to prepare the space required for the formation of vias, and thus making it possible to significantly reduce the size of the built-in component substrate.

According to a preferred embodiment of the present invention, a Bi—Sn alloy paste with a low melting point is preferably used as the metal paste which can be melted at a lower temperature than the insulating resin layer. Thus, the double-sided substrate or built-in component substrate can be manufactured to have its reliability of the electrical connection improved spectacularly.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail with reference to FIGS. 1A to 9D.

First Preferred Embodiment

First, a first preferred embodiment of the present invention will be described with reference to FIGS. 1A to 4.

FIGS. 1A-1D show a method for manufacturing a substrate according to the present preferred embodiment in process sequence.

Figure 1A:
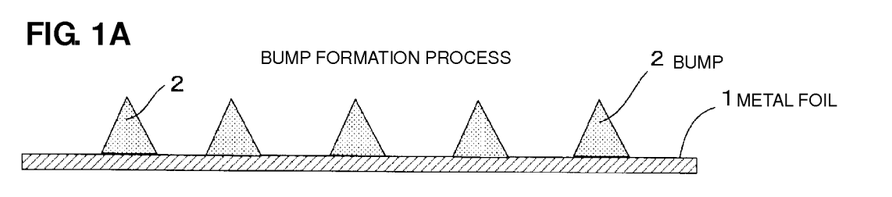
FIGS. 1A-1D are explanatory views of a method for manufacturing a substrate (single layer substrate) according to a first preferred embodiment of the present invention.
Figure 2:
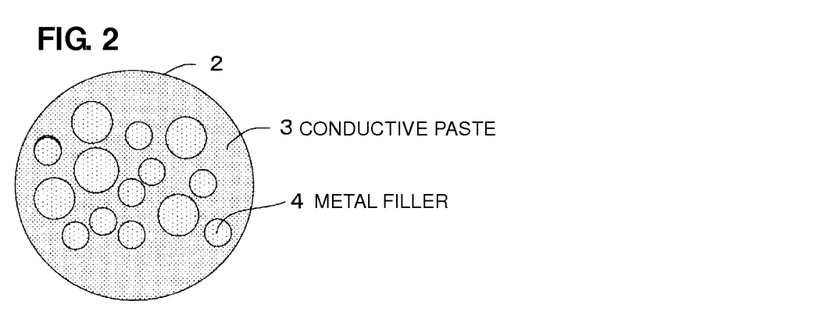
FIG. 2 is a cross-sectional view illustrating the state of a bump in the bump formation process (before heating) in FIGS. 1A-1D.

In a first bump formation step (FIG. 1A), one metal foil 1 is prepared as a carrier contact-bonded to one principal surface of a thermosetting insulating resin layer formed from an epoxy resin or other suitable material as will be described later, and bumps 2 of a conductive paste including metal fillers which can be melted at a temperature lower than the curing temperature (around 180° C.) of the insulating resin layer are formed on the surface of the metal foil 1. FIG. 2 shows a transverse section of the bump 2 in a bump formation process (before heating), and particles of metal fillers 4 are scattered substantially homogeneously in a conductive paste 3 in the bump 2 before heating.

The metal foil 1 may be fundamentally various types of metal foils with good solderability, and in the present preferred embodiment, practical copper (Cu) foil, for example, is preferably used as the metal foil 1. However, a metal foil may be used which is obtained by plating a metal surface with poor solderability with a metal with good solderability (aluminum (Al), etc.). However, the metal foil 1 preferably has appropriate mechanical strength after the formation of the substrate. Then, the metal foil 1 may be formed into a desired wiring pattern by a subtractive method or the like, if necessary.

The bumps 2 are formed by, for example, printing the conductive paste 3 containing the metal fillers 4 on the surface of the metal foil 1, in accordance with a known metal mask method, and shaped in a conical mound from the surface of the metal foil 1.

The metal fillers 4 in the bumps 2 may be any fillers of metallic materials, as long as the metallic materials can be melted at a temperature sufficiently lower than the solder reflow temperature (on the order of about 240° C. to about 260° C., for example) and lower than the curing temperature (around 200° C., for example) of the insulating resin layer as described previously, and specifically, in the case of the present preferred embodiment, Bi (bismuth)-Sn (tin) alloy fillers with a melting point of substantially 140° C. are preferably used, for example. However, various types of metal fillers may be used which have a low melting point not more than In (indium) as shown in Table 1 below. It is to be noted that in view of the mechanical strength of the metal with a metallic bond by melting, the metal fillers 4 are most preferably Bi—Sn alloy fillers mentioned above.

TABLE 1

| Metal Species | Melting Point (° C.) |
| --- | --- |
| Sn | 232 |
| In | 157 |
| Bi—Sn | 138 |
| In—Sn | 117 |
| Bi—Pb—Sn | 95 |
| Bi—Pb—Sn—Cd | 72 |
| Bi—Pb—Sn—Cd—In | 43 |

Figure 3:
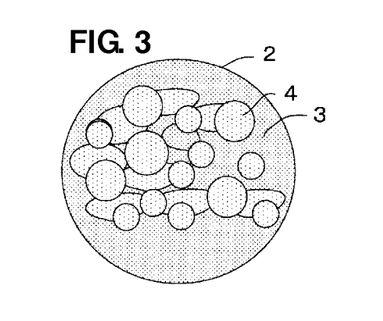
FIG. 3 is a cross-sectional view illustrating the state of the bump in the metal column formation process (after heating) in FIGS. 1A-1D.

In the next metal column formation process (FIG. 1B), the bumps 2 are heated to a temperature lower than the curing temperature mentioned above, at which the metal fillers 4 are melted, for example, a temperature of about 140° C. or more and about 180° C. or less, to form the metal fillers 4 bound to each other by melting, and form a metallic bond between the bump 2 and the metal foil 1, thereby integrally connecting the metal columns 5 of the bumps 2 to the metal foil 1. FIG. 3 shows a transverse section of the bump 2 in the metal column formation process (after heating), in which the bumps 2 after heating are adhesively attached to each other through the metal fillers 4 melted, but undergo a small change in outer shape.

In the next press-fitting process (FIG. 1C), first, a thermosetting insulating resin layer 6 is prepared to contact-bond the other (new) metal foil 7 onto the other principal surface of the uncured insulating resin layer 6, thereby forming a metal foil 8 with the resin.

The insulating resin layer 6 may be an appropriately thick layer of an insulating resin for various types of organic substrates, which is thermally cured at a temperature lower than the solder reflow temperature mentioned above, and specifically, is a layer such as an epoxy resin, an acrylic resin, a phenol resin, or a cyanate resin which has a curing temperature of about 200° C., for example, and the layer may include, as inorganic fillers, fillers of inorganic powders such as a silica powder and an alumina powder. The metal foil 7 is preferably composed of a metallic material in the same condition as in the case of the metal foil 1, for example, copper foil, which forms a wiring pattern on the other principal surface of the insulating resin layer 6.

Then, the metal foil 8 with the resin is positioned so as to overlap with the metal foil 1 above the metal columns 5 with the metal foil 7 facing up, and pressed down for pressurization by a pressing machine or other suitable device while heating to about 100° C. to about 140° C., for example, thereby causing the metal columns 5 to penetrate through the insulating resin layer 6 to bring the tips of the metal columns 5 into abutment (contact) with the metal foil 7, and thus physically connect the metal columns 5 to the metal foil 7.

In this case, while the bumps 2 may have the shape of a flat-topped circular truncated cone, the bumps 2 have a conical shape with a sharp tip in the case of the present preferred embodiment, and the metal columns 5 formed by the bumps 2 also preferably may have substantially the same shape. Thus, the bumps 2 have an advantage that the metal columns 5 easily penetrate through the insulating resin layer 6, so that the metal columns 5 are favorably connected to the metal foil 7. More specifically, in the case of the bumps 2 in the shape of a circular truncated cone, the metal fillers 4 of the bumps 2 are trapped in the top end surfaces of the bumps 2 to make the top surface flat. Thus, it is not easy to penetrate through the insulating resin layer 6, and there is a possibility of causing a defective connection between the metal columns 5 and the metal foil 7. In contrast, when the bumps 2 are formed to have a conical shape with a sharp tip as in the present preferred embodiment, the bumps 2 easily penetrate through the insulating resin layer 6, thereby ensuring that the metal columns 5 are brought into abutment with the metal foil 7, and thus ensuring that the metal columns 5 are electrically connected to the metal foil 7.

It is to be noted that while methods such as filling conical grooves with a paste and transferring the paste have been proposed conventionally as a method for forming the conical bumps 2 in a stable manner, this type of conventional approach is not practical because of the increased number of processes required.

Thus, in the case of the present preferred embodiment, a sheet or plate (hereinafter, referred to as a printing mask) with holes made in advance in predetermined positions (in bump formation positions) is first prepared in the bump formation process for forming the bumps 2 by a printing method. Next, with the printing mask and the metal foil 1 to be subjected to printing closely attached to each other, the resin paste 3 containing the metal fillers 4 is applied over the printing mask with the use of a squeegee or other suitable device to fill the hole section with the resin paste 3. Next, the printing mask is pulled apart in the vertical direction from the metal foil 1 with a paste residue on the order of about 50 μm to about 100 μm, for example, left on the printing surface through the printing. In this case, the excess resin paste 3 adhering to the printing mask is peeled off from the metal foil 1, so that the conical bumps 2 are shaped automatically.

Thus, the simple operation of printing the resin paste 3, and then peeling off the printing mask to leave some of the resin paste 3 on the surface of the metal foil 1 makes it possible to achieve the conical bumps 2 in a stable manner, without newly introducing expensive equipment or the like.

Figure 4:
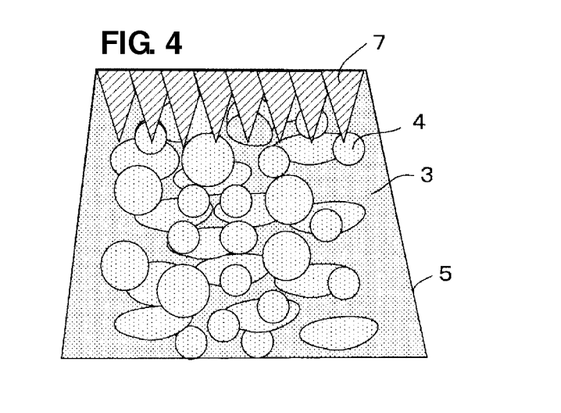
FIG. 4 is a cross-sectional view illustrating the state of the bump in the reheating and pressure-fitting process (after reheating) in FIGS. 1A-1D.

Then, in the next reheating and contact bonding process (FIG. 1D), the insulating resin layer 6 with the metal columns 5 penetrating therethrough is pressurized while heating the insulating resin layer 6 to the curing temperature of the insulating resin layer 6 or more, for example, to about 180° C. to about 200° C., to re-melt the metal fillers 4 in the metal columns 5 while curing the insulating resin 6, and thus form a metallic bond between the metal columns 5 and the metal foil 7, thereby integrally connecting the metal columns 5 to the metal foil 7, to produce a substrate 9 which has a structure with the insulating resin layer 6 sandwiched between the metal foils 1 and 7. FIG. 4 is a longitudinal sectional view of the metal column 5, which illustrates the metal column 5 integrally connected to the metal foil 7 by a metallic bond.

The manufacture of the substrate 9 as described above provides the interlayer connection between the metal foils 1 and 7 of the substrate 9 through the use of the metal columns 5, and thus eliminates the need for any treatment such as hole-forming processing for via formation, thereby making it possible to reduce the number of processes, and thus achieving significant cost reduction, and forms the metal columns 5 by melting the metal fillers 4 of the bumps 2 and forming metallic bonds between the metal columns 5 and the metal foils 1 and 7, rather than by providing conventional physical contacts between bumps, thus greatly improving the reliability of the electrical connection, and making it possible to provide the double-sided wiring board 9 with high reliability.

Second Preferred Embodiment

Next, a second preferred embodiment of the present invention will be described with reference to FIGS. 5A and 5B.

Figure 1B:
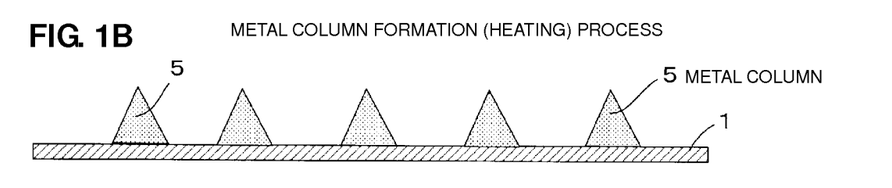
Figure 1C:
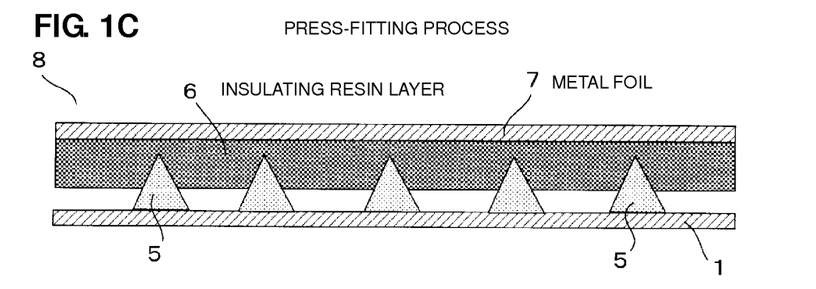
Figure 1D:
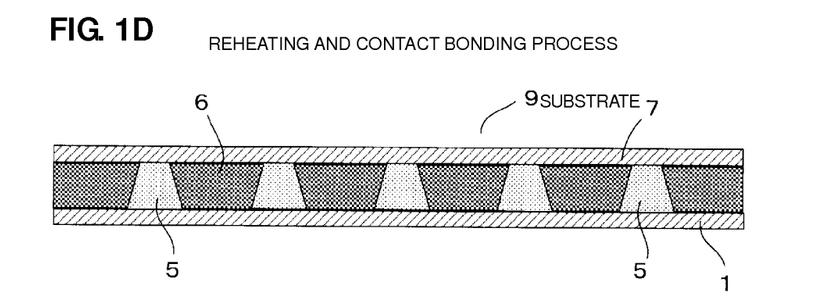

In the case of the present preferred embodiment, the metal columns 5 integrally connected to the metal foil 1 in FIG. 1B are preferably formed on, for example, a transfer plate (not shown) according to the bump formation step and metal column formation in the first preferred embodiment.

Figure 5A:
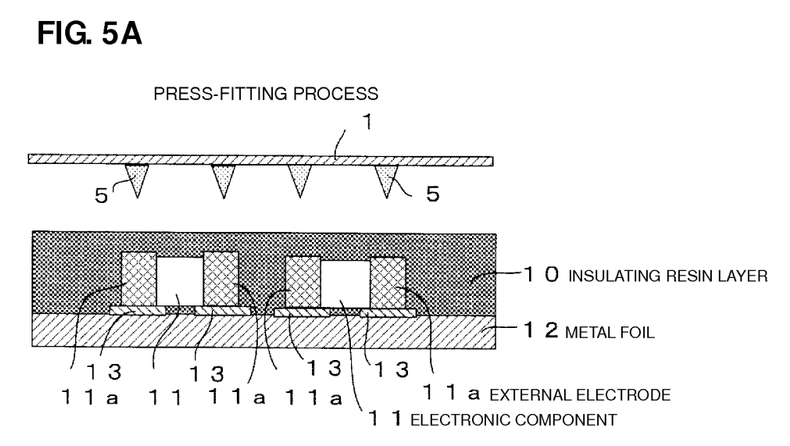
FIGS. 5A and 5B are explanatory views of a method for manufacturing a substrate (built-in component substrate) according to a second preferred embodiment of the present invention.

Next, an insulating resin layer 10 with components built therein is prepared in a press-fitting process in FIG. 5A in place of the press-fitting process in FIG. 1C. The insulating resin layer 10 is formed, for example, by burying one or more electronic components 11 such as coils, capacitors, transistors, and ICs in the uncured resin layer 6 according to the first preferred embodiment, and a wiring pattern of a metal foil 12 corresponding to the metal foil 7 in FIG. 1C is contact-bonded to the lower surface of the insulating resin layer 10. The electronic components 11 have, for example, at right and left ends thereof, external electrodes 11a connected to the metal foil 12 with lands 13 interposed therebetween.

Then, the metal foil 1 with the metal columns 5 facing down is set above the insulating resin layer 10, and a pressing machine or the like is used to press the metal foil 1 down or press the insulating resin layer 10 up for pressurization, while heating to about 100° C. to about 140° C., for example. In this case, the metal columns 5 are located just above the corresponding external electrodes 11a, and the metal columns 5 are press-fitted into the insulating resin layer 6 to bring the tips of the metal columns 5 into abutment (contact) with at least the upper surfaces of the external electrodes 11a, and thus physically connect the metal columns 5 to the external electrodes 11a.

In the next reheating and contact bonding process (FIG. 5B), the insulating resin layer 10 is pressurized while heating the insulating resin layer 10 to the curing temperature of the insulating resin layer 10 or more to re-melt the metal fillers 4 in the metal columns 5 while curing the insulating resin 6, and thus form a metallic bond between the metal columns 5 and the external electrodes 11a, thereby integrally connecting the metal columns 5 to the external electrodes 11a.

Then, the metal foil 1 is subjected to photo-etching or the like to form a predetermined wiring pattern of a metal foil 14 on the upper surface of the insulating resin layer 10, thereby connecting the metal foil 14 to the external electrodes 11a of the electronic components 11 through the metal columns 5 to produce a substrate 15 with components built therein.

The manufacture of the substrate 15 as described above provides the connection between the metal foil 14 of the substrate 15 and the external electrodes 11a of the electronic components 11 through the use of the metal columns 5, and thus eliminates the need for any treatment such as hole-forming processing for via formation, thereby making it possible to reduce the number of processes, and thus achieving significant cost reduction, and forms the metal columns 5 by melting the metal fillers 4 of the bumps 2 and forming metallic bonds between the metal columns 5 and the external electrodes 11a and metal foil 14, rather than by providing conventional physical contacts between bumps, thus extremely improving the reliability of the electrical connection, and making it possible to provide the high-reliability substrate 15 with components therein. Furthermore, as indicated by an arrow in FIG. 5B, the metal foils 12 and 14 are electrically connected to each other without forming any vias.

Modification Example

Figure 6:
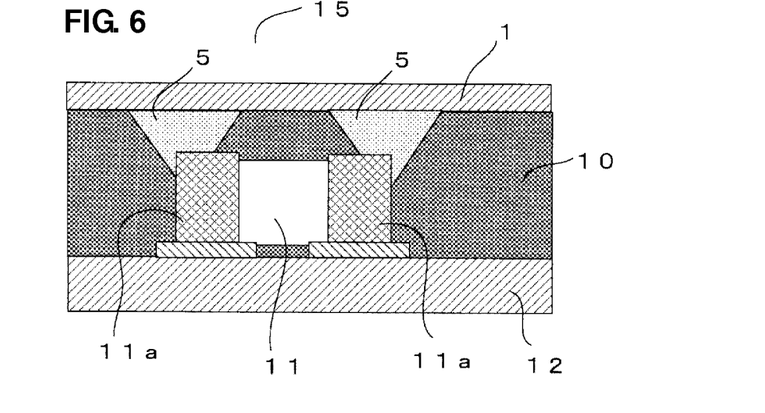
FIG. 6 is an explanatory view of a modification example according to the second preferred embodiment of the present invention.

Incidentally, the metal columns 5 preferably have a larger area of the base on the metal foil 1 side, and have contact with the external electrodes 11a in a straddling and protruding manner. FIG. 6 shows the metal columns 5 in contact with external the electrodes 11a in a straddling and protruding manner through the press-fitting process.

More specifically, in the case of providing connections through conventional vias, processing down to the bottom has to be carried out without damaging external electrodes. Thus, via processing itself is difficult, and it is thus difficult to control the processing conditions. In addition, the variation in component height, the variation in mounting, etc., cause a failure to control the thickness of the insulating resin layer 10 on the external electrodes 11a, thereby causing defective processing.

Figure 5B:
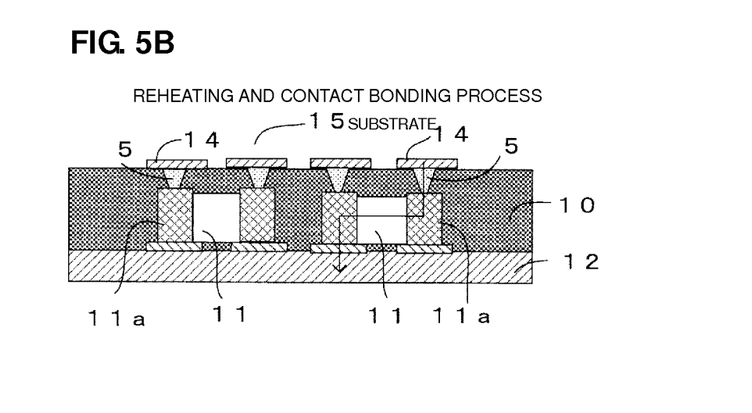

Furthermore, in the case of the metal columns 5 in FIGS. 5A and 5B, the projected area of the metal column 5 viewed from above is smaller than the above surface of the external electrode 11a, and decreased as the electronic component 11 is reduced in size. Thus, very high processing accuracy is required in combination with accuracy in component mounting, and it is not easy to form the metal columns 5 so as to provide connections reliably.

Therefore, it is conceived that, as shown in FIG. 6, the metal columns 5 with a large projected area are formed so as to straddle and protrude from the external electrodes 11a.

In this case, when the bumps 2 of the conductive paste 3 including a low melting point component as a mixture are printed in predetermined positions in advance on the metal foil 1, and subjected to a heat treatment to form the metal columns 5, the bumps 2 of the conductive paste 3 are formed in a manner that straddles and protrudes from the external electrodes 11a of the electronic component 11. It is to be noted that the bumps 2 may have any planar projection shapes such as a circle shape, a quadrangle shape, and a cross shape, as long as the shape protrudes from the projected area section of the external electrode 11a.

Then, the metal columns 5 formed so as to straddle and protrude from the external electrodes 11a ensure that the metal columns 5 are connected to the external electrodes 11a by metallic bonds, thereby making it possible to easily achieve electrical connections with high reliability, even when the electronic component is reduced in size.

In addition, the formation of the bumps 2 taller than the thickness of the insulating resin layer 10 on the electronic component 11 has the advantage of making it possible to cause the bumps 2 to collide with the external electrodes 11a to crush the tips of the bumps 2, thereby adjusting the height of the metal columns 5, and addressing the variation in the height of the built-in electronic component 11 in a flexible manner (on the order of several tens of μm, for example).

Furthermore, the external electrodes 11a are prevented from damage, because there is no need to irradiate the external electrodes 11a with a laser.

In addition, there is also an advantage that the processing accuracy is relaxed, which is required for bringing the conductive paste and the external electrodes 11a into contact with each other.

Third Preferred Embodiment

Next, a preferred embodiment in FIGS. 7A and 7B will be described, in which the metal columns 5 are used for interlayer electrical connection between wiring patterns on the both principal surfaces of the insulating resin layer 10.

Figure 7A:
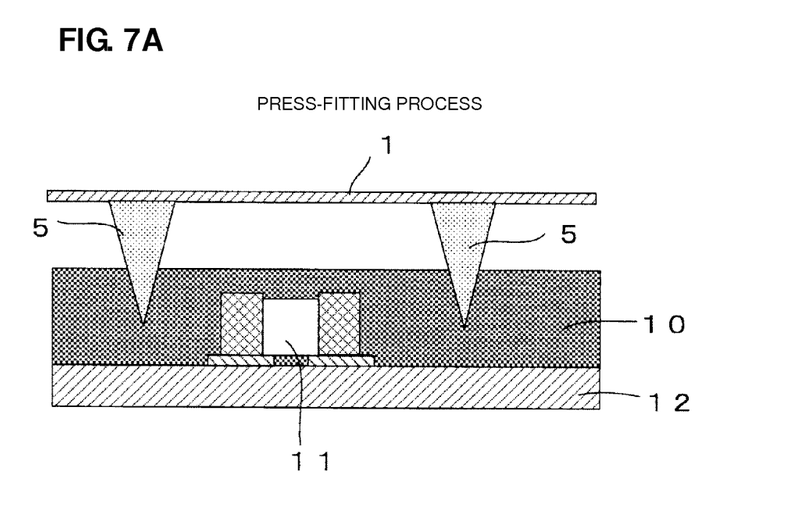
FIGS. 7A and 7B are explanatory views of a method for manufacturing a substrate (built-in component substrate) according to a third preferred embodiment of the present invention.
Figure 7B:
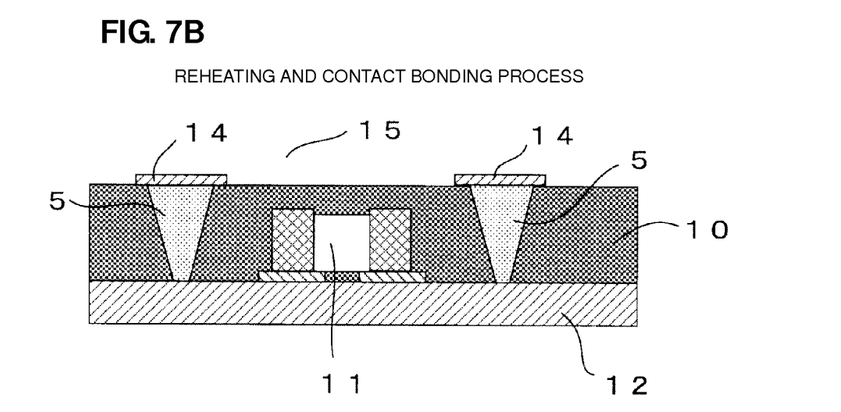

In this case, as shown in the press-fitting process of FIG. 7A and the reheating and contact bonding process of FIG. 7B, the metal columns 5 are press-fitted, for example, to the downward direction near the electronic component 11 to connect the tips of the metal columns 5 to the metal foil 12, thereby allowing an interlayer electrical connection of the substrate 15 with the component built therein to be achieved simply and reliably, as compared with the conventional formation through vias.

Fourth Preferred Embodiment

Figure 8A:
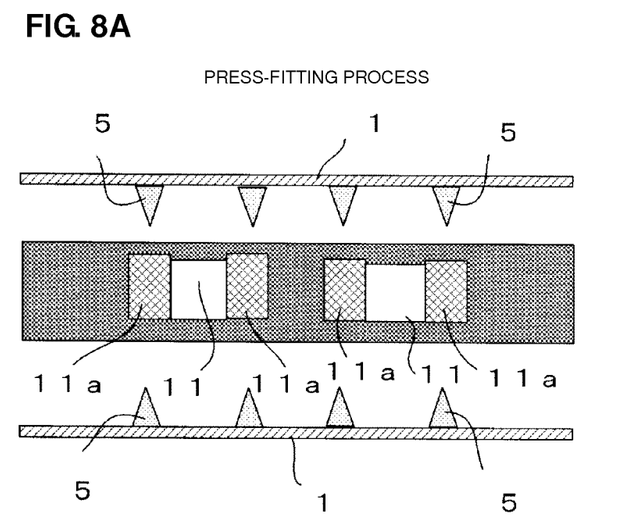
FIGS. 8A and 8B are explanatory views of a method for manufacturing a substrate (built-in component substrate) according to a fourth preferred embodiment of the present invention.
Figure 8B:
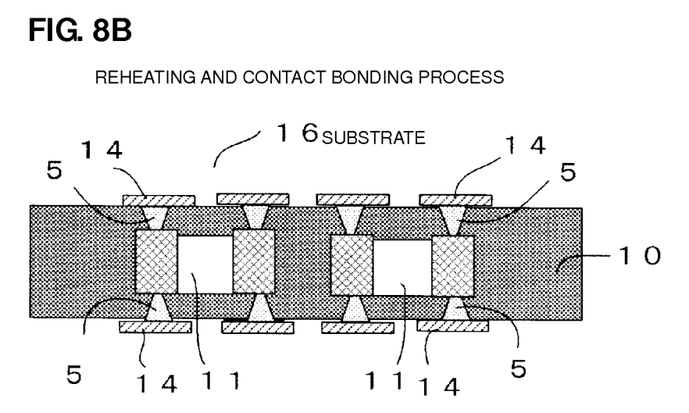

Next, a preferred embodiment of press-fitting the metal columns 5 from both principal surfaces of the insulating resin layer 10 with electronic component 11 built therein to electrically connect the external electrodes 11a will be described with reference to FIGS. 8A and 8B.

In the case of the present preferred embodiment, in a press-fitting process (FIG. 8A), the metal foil 1 with the metal columns 5 formed is set on the top and bottom of the insulating resin layer 10, and the metal columns 5 are press-fitted into the insulating resin layer 6 from the both principal surfaces thereof to bring the tips of the metal columns 5 into abutment (contact) with the upper and lower surfaces of the external electrodes 11a, and thus physically connect the metal columns 5 on the both principal surfaces to the external electrodes 11a.

In addition, in the next reheating and contact bonding process (FIG. 8B), the insulating resin layer 10 is pressurized while heating the insulating resin layer 10 to the curing temperature of the insulating resin layer 10 or more, to form metallic bonds between the metal columns 5 on the both principal surfaces and the external electrodes 11a, thereby integrally connecting the metal columns 5 to the external electrodes 11a.

Then, the metal foils 1 on the both principal surfaces are subjected to photo-etching or the like to form the predetermined wiring pattern of the metal foil 14 on the upper and lower surfaces of the insulating resin layer 10, thereby electrically connecting the metal foils 14 to the external electrodes 11a of the electronic components 11 through the metal columns 5 to produce a substrate 16 with components built therein.

Fifth Preferred Embodiment

Next, a preferred embodiment in FIGS. 9A-9D will be described, which is applied to the manufacture of a multilayer substrate including a structure in which a substrate corresponding to the substrate 9 according to the first preferred embodiment is stacked multiple times.

Figure 9A:
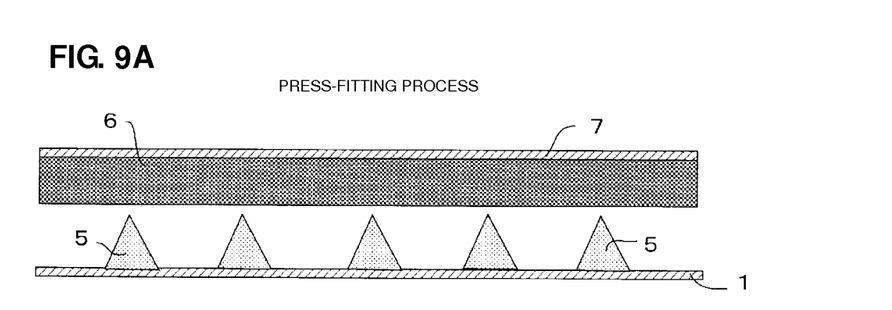
FIGS. 9A-9D are explanatory views of a method for manufacturing a substrate (built-in component substrate) according to a fifth preferred embodiment of the present invention.
Figure 9B:
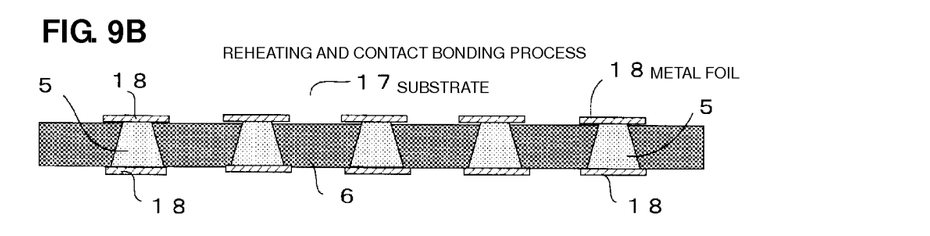
Figure 9C:
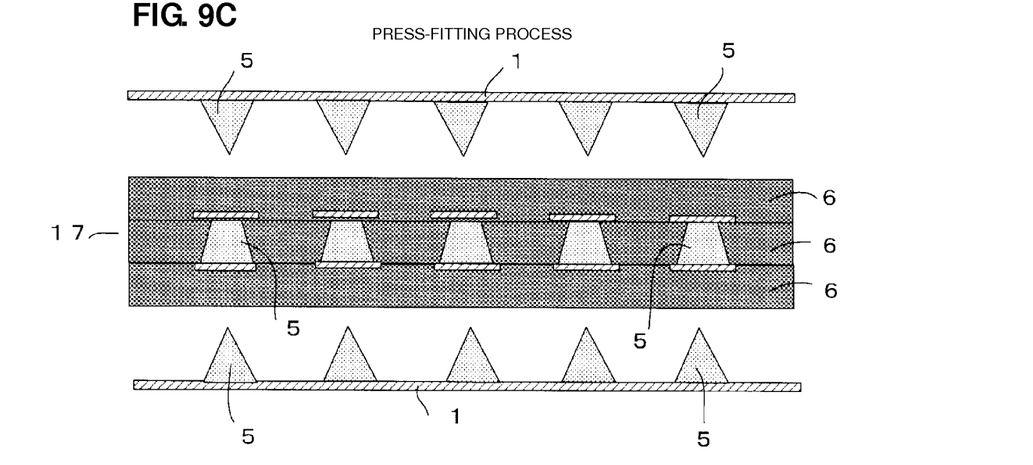

First, a substrate 17 corresponding to the substrate 9 in FIG. 1C is formed through an initial press-fitting process (FIG. 9A) and reheating and contact bonding process (FIG. 9B). The substrate 17 has the upper and lower metal foils 1 processed into a metal foil 18 in a wiring pattern.

Next, through a second press-fitting process (FIG. 9C) and reheating and contact bonding process (FIG. 9D), the insulating resin layer 6 is further contact-bonded onto the top and bottom of the substrate 17, and the metal foil 1 with the metal columns 5 formed is press-fitted from the top and bottom, and then subjected to reheating and contact bonding to form metallic bonds, thereby producing a substrate 19 which has a four-layer structure.

Figure 9D:
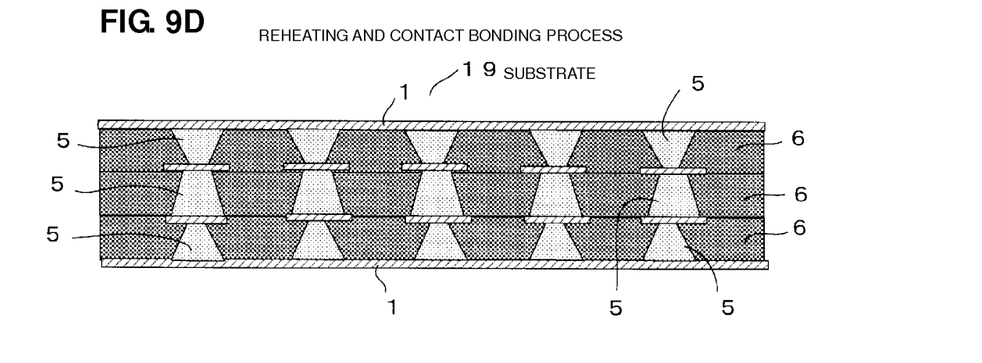

Also in this case, the interlayer electrical connections between the respective layers are achieved by the metal columns 5 to produce the same effect as in the first preferred embodiment, etc.

Furthermore, the present invention is not limited to the respective preferred embodiments described above, various changes can be made to the preferred embodiments without departing from the spirit of the present invention, and for example, the multilayer substrate 19 according to the fifth preferred embodiment may be a substrate with components built therein.

Next, the shape, size, etc., of the insulating resin layers 6 and 10, metal columns 5, etc. according to the respective preferred embodiments are not limited to those described above.

The present invention can be applied to methods for manufacturing double-sided wiring boards and multilayer wiring substrates in a variety of applications.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing a substrate, comprising the steps of:

forming a bump of a conductive paste containing metal fillers on a metal foil which is to be contact-bonded to a thermosetting insulating resin layer, the metal fillers having a melting temperature lower than a reflow temperature of the conductive paste and lower than a curing temperature of the insulating resin layer;

heating the bump to a temperature lower than the curing temperature, at which the metal fillers are melted, to form the metal fillers bound to each other by melting, and to form a metallic bond between the bump and the metal foil, thereby integrally connecting a metal column of the bump to the metal foil;

press-fitting the metal column into the insulating resin layer before being completely cured, thereby contact-bonding the metal foil to the insulating resin layer, and joining a tip of the metal column to an opposed metallic member; and subjecting the insulating resin layer to a heat treatment after the joining to reheat the metal column, thereby re-melting the metal fillers, and forming a metallic bond between the metal column and the metallic member to integrally connect the metal column to the metallic member; wherein in the step of subjecting the insulating resin layer to a heat treatment, the metallic bond between the metal column and the metallic member is formed by alloying through diffusion in a solid layer between the metal column and the metallic member.

2. The method for manufacturing a substrate according to claim 1, wherein the metal foil is a metal foil contact-bonded to one principal surface of the insulating resin layer, and the metallic member is a metal foil contact-bonded to the other principal surface of the insulating resin layer.

3. The method for manufacturing a substrate according to claim 1, wherein the insulating resin layer includes a built-in electronic component, and the metallic member is an electrode of the electronic component.

4. The method for manufacturing a substrate according to claim 1, wherein the conductive paste includes a Bi—Sn alloy.

5. The method for manufacturing a substrate according to claim 1, wherein the melting temperature of the metal fillers is between about 140° C. and about 180° C.

6. The method for manufacturing a substrate according to claim 1, wherein the reflow temperature of the conductive paste is a solder reflow temperature.

* * * * *